United States Patent
Sugimoto

(10) Patent No.: US 7,719,347 B2
(45) Date of Patent: May 18, 2010

(54) SEMICONDUCTOR INTEGRATED CIRCUIT AND METHOD OF CONTROLLING THE SAME

(75) Inventor: Hideki Sugimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 64 days.

(21) Appl. No.: 12/230,907

(22) Filed: Sep. 8, 2008

(65) Prior Publication Data

US 2009/0072894 A1   Mar. 19, 2009

(30) Foreign Application Priority Data

Sep. 19, 2007   (JP)   ............... 2007-242012

(51) Int. Cl.
G05F 1/10   (2006.01)
(52) U.S. Cl. ..................... 327/544; 327/534
(58) Field of Classification Search ............ 327/530, 327/534, 537, 544
See application file for complete search history.

(56) References Cited

U.S. PATENT DOCUMENTS 6,087,892 A * 7/2000 Burr ................. 327/534
7,276,956 B2   10/2007 Furuta et al.
7,425,861 B2 * 9/2008 Egerer et al. ........... 327/534

FOREIGN PATENT DOCUMENTS

JP   2006-012968 A   1/2006

* cited by examiner

*Primary Examiner*—Jeffrey S Zweizig
(74) *Attorney, Agent, or Firm*—Foley & Lardner LLP

(57) ABSTRACT

In related arts, a body voltage needs to be controlled by separately detecting external environment such as temperature. In the related art, variation such as a process parameter for each individual product has not been considered. A semiconductor integrated circuit according to the present invention includes a comparator comparing a leak current of a first conductive type transistor with a leak current of a second conductive type transistor to output a comparing result, and a conduction control signal generator outputting a signal determining a conduction state of the first conductive type transistor and a conduction state of the second conductive type transistor in a power saving control target circuit in a power saving mode based on the comparing result.

10 Claims, 12 Drawing Sheets

SEMICONDUCTOR INTEGRATED CIRCUIT AND METHOD OF CONTROLLING THE SAME

BACKGROUND OF THE INVENTION

1. Field of the Invention

The present invention relates to a logic circuit and a semiconductor integrated circuit including the logic circuit, and more particularly, to a circuit configuration and a method of controlling the circuit suitable for a power saving operation.

2. Description of Related Art

In recent years, a manufacturing process of a semiconductor integrated circuit has been miniaturized. Therefore, a withstand voltage of an MOS transistor forming the semiconductor integrated circuit such as a CMOS LSI has been decreasing and an operating voltage of the MOS transistor needs to be decreased. As the operating voltage decreases, operation speed of the MOS transistor is reduced. In order to prevent the operation speed from being reduced, a threshold voltage of the MOS transistor needs to be decreased.

However, when the threshold voltage is decreased (for example about 0.4 V or less), the transistor is not completely turned off, and a subthreshold leak current may flow between a drain and a source. This leak current causes a serious problem in the semiconductor integrated circuit such as an LSI formed by a plurality of MOS transistors. This is because a pass-through current is generated due to the leak current of the transistor even when the circuit in the semiconductor integrated circuit is logically in a disable state. There are caused significant problems due to the pass-through current such as increase of power consumption, increase of a load on a power source, decrease of energy consumption efficiency, and increase of heat release. Specifically, in the CMOS LSI performing high-speed operation, since the leak current increases in a speed exceeding the operating current due to the miniaturization of the transistor, the leak current needs to be reduced even in a slight time between operations.

A technique for reducing the leak current of the transistor requiring the high-speed operation and having a low threshold voltage is needed to realize both a circuit where the low-power operation is required and a circuit requiring the high-speed operation. Further, the above-mentioned problem can further be serious since the subthreshold leak current exponentially increases in high-temperature operation of the semiconductor integrated circuit. In order to overcome this problem, a technique for reducing the leak current in the circuit is necessary.

Various techniques for reducing the leak current have been suggested. One of such techniques is disclosed in Japanese Unexamined Patent Application Publication No. 2006-12968 (hereinafter referred to as related art). This related art relates to a configuration and a method of controlling a body voltage of a transistor for the purpose of reducing power consumption by reducing the leak current. In this related art, a source potential control circuit supplies source potential needed for an internal circuit block through a source potential line so as to control a current of a PMOS transistor.

However, we have now discovered that there is a problem in the above related art that the body voltage cannot finely be controlled in a short time. Further, there are problems that external environment such as temperature needs to be separately detected in performing the switching control, and that the variation such as a manufacturing process for each individual product has not been considered.

SUMMARY

A semiconductor integrated circuit according to the present invention includes a comparator comparing a leak current of a first conductive type transistor with a leak current of a second conductive type transistor to output a comparing result, and a conduction control signal generator outputting a signal determining a conduction state of the first conductive type transistor and a conduction state of the second conductive type transistor in a control target circuit in a power saving mode based on the comparing result.

According to the semiconductor integrated circuit of the present invention, in the power saving mode, the signal output from the conduction control signal generator is generated based on the comparing result from the comparator including the first conductive type transistor and the second conductive type transistor having a similar configuration as those in the control target circuit when the leak current of the first conductive type transistor in the control target circuit is larger than the leak current of the second conductive type transistor in the control target circuit, for example. Then the conduction state of the first conductive type transistor in the control target circuit can be controlled by the signal from the conduction control signal generator. Accordingly, it is possible to control the circuit in an optimal power saving state according to ambient temperature or a manufacturing process without being affected by the operating speed and to realize reducing of the average or maximum power consumption.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
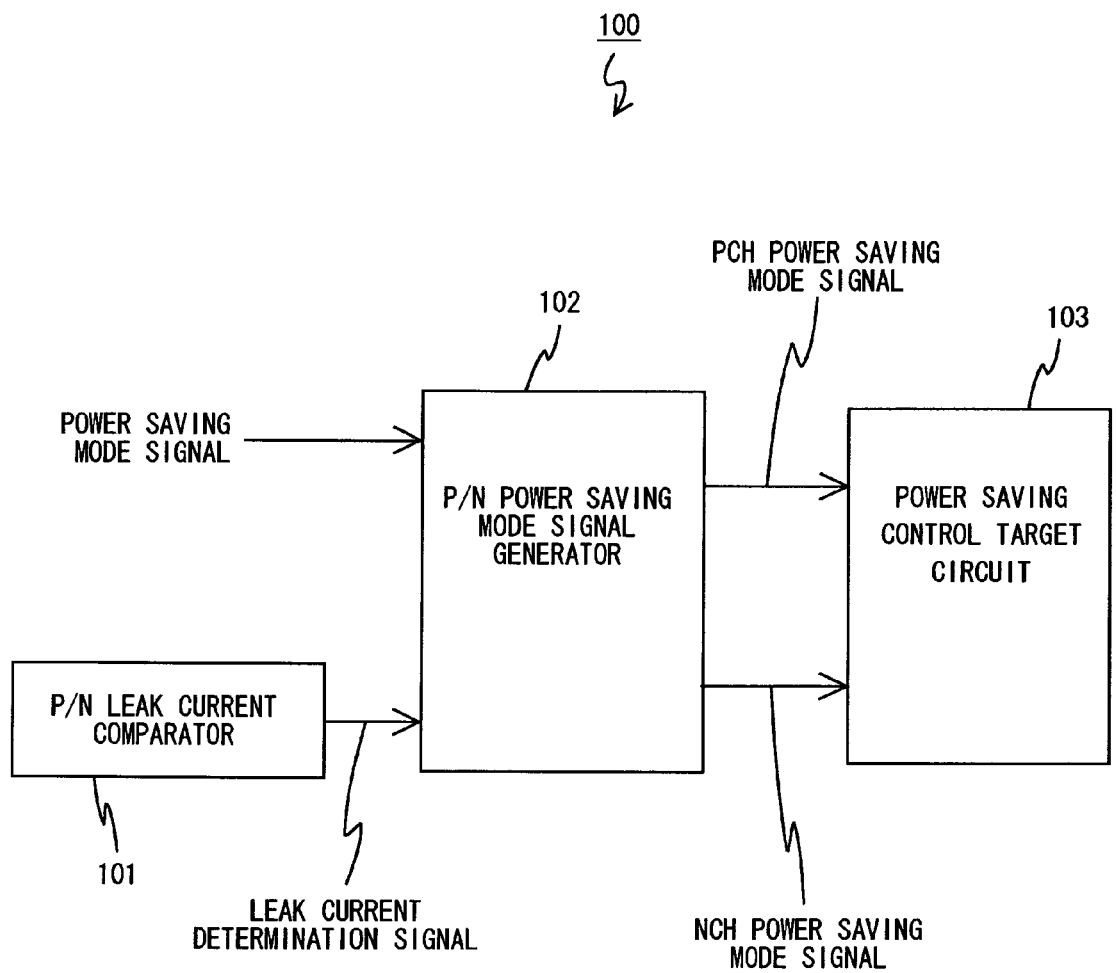
FIG. 1 is one example of a block configuration of a semiconductor integrated circuit according to a first embodiment.

The embodiments of the present invention will now be described with reference to the accompanying drawings. FIG. 1 shows a block configuration example of a semiconductor integrated circuit 100 according to the first embodiment. Note that a processing part of only one stage in an instruction pipeline processing part in a CPU (Central Processing Unit) of a microcomputer is shown in FIG. 1.

As shown in FIG. 1, the semiconductor integrated circuit 100 according to the first embodiment includes a P/N leak current comparator 101, a P/N power saving mode signal generator (conduction control signal generator) 102, and a power saving control target circuit 103.

The P/N leak current comparator 101 includes a PMOS transistor (first transistor, for example) and an NMOS transistor (second transistor, for example). Then the P/N leak current comparator 101 compares a leak current of the PMOS transistor with a leak current of the NMOS transistor to determine which of the two transistors has a larger leak current and outputs the comparing result. These PMOS and NMOS transistors are manufactured by a manufacturing process same to that of transistors (transistors used for an output buffer, for example) existing in the power saving control target circuit 103 to generate the high leak current. The P/N leak current comparator 101 outputs a leak current determination signal as the comparing result. For example, a high-level leak current determination signal is output when the leak current of the PMOS transistor is larger, and a low-level leak current determination signal is output when the leak current of the NMOS transistor is larger. Note that it is not necessary to determine that the case in which the leak current of the PMOS transistor is larger as the high level but the logical value can be reversed.

Although the present embodiment assumes that the transistors existing in the power saving control target circuit 103 to generate the high leak current is only one set of the PMOS and NMOS transistors, the present invention is not limited to this case. When there are plurality of sets of the PMOS and the NMOS transistors, the transistors of the P/N leak current comparator 101 may be formed in consideration of the influence caused by combining the plurality of transistors. For example, when the transistors generating a plurality of high leak current are formed to have different sizes, the transistors of the P/N leak current comparator 101 may be formed to have the average size.

Figure 2:
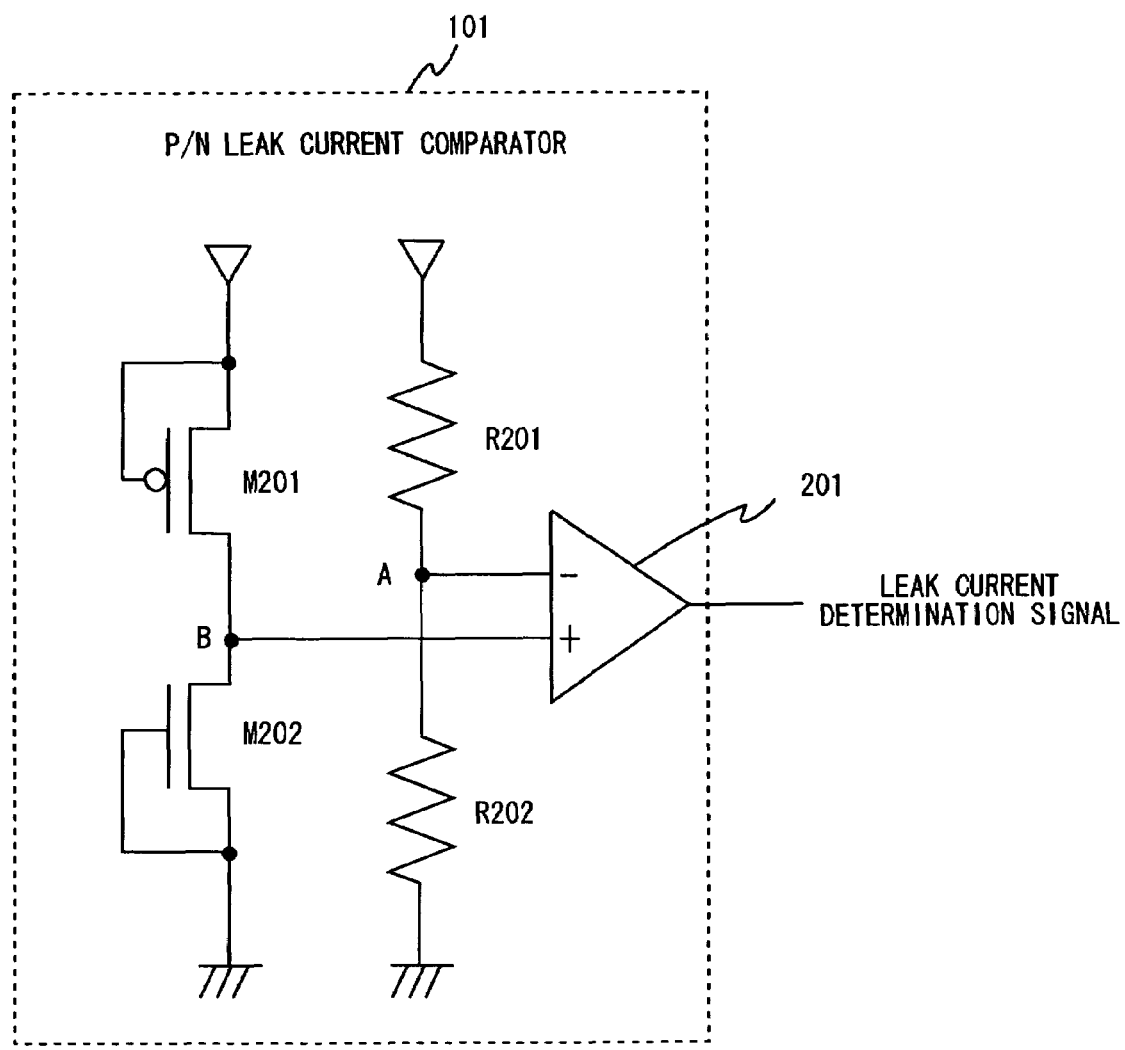
FIG. 2 is one example of a configuration of a P/N current comparator of the semiconductor integrated circuit according to the first embodiment.

In FIG. 2, a specific configuration example of the P/N leak current comparator 101 is shown. The P/N leak current comparator 101 includes a PMOS transistor M201, an NMOS transistor M202, a resistor R201 (first resistance element, for example), a resistor R202 (second resistance element, for example), and a comparator 201. A source and a gate of the PMOS transistor M201 are connected to a high-potential side power supply (VDD), and a drain thereof is connected to a node B. A drain of the NMOS transistor M202 is connected to the node B, and a source and a gate thereof are connected to a low-potential side power supply (GND). The resistor R201 is connected between the high-potential side power supply and a node A. The resistor R202 is connected between the node A and the low-potential side power supply. An inverting input terminal of the comparator 201 is connected to the node A, a non-inverting input terminal thereof is connected to the node B, and an output terminal thereof is connected to the P/N power saving mode signal generator 102. The comparator 201 outputs a high-level signal (VDD level, for example) when the potential of the node B is higher than that of the node A, and outputs a low-level signal (GND level, for example) when the potential of the node B is lower than that of the node A.

As will be clear from the connection relation shown in FIG. 2, both of the PMOS transistor M201 and the NMOS transistor M202 are in OFF state. The leak current flows in the PMOS transistor M201 and the NMOS transistor M202, and the potential of the node B is determined by a magnitude relation of the leak currents of these transistors M201 and M202. For example, when the leak current of the PMOS transistor M201 is larger than that of the NMOS transistor M202, the potential of the node B is made high. On the contrary, when the leak current of the NMOS transistor M202 is larger than that of the PMOS transistor M201, the potential of the node B is made low. As stated, by comparing the reference voltage resistively divided by the resistor R201 and the resistor R202 in the node A with the voltage of the node B by the comparator 201, the leak current of the PMOS transistor M201 or the leak current of the NMOS transistor M202 which is relatively larger can be detected. The comparator 201 outputs the detection result as the leak current determination signal. For example, when the potential of the node B is higher than that of the node A, the high-level leak current determination signal is output. On the other hand, when the potential of the node B is lower than that of the node A, the low-level leak current determination signal is output.

Note that the resistor R201 and the resistor R202 may have the same resistance values. In this case, the voltage of the node A is VDD/2. As a matter of course, the resistance values of the resistor R201 and the resistor R202 can be changed in accordance with the manufacturing process parameter of the semiconductor integrated circuit.

The P/N power saving mode signal generator 102 receives a power saving mode signal described later and the leak current determination signal from the P/N leak current comparator 101 described above. The P/N power saving mode signal generator 102 outputs a Pch power saving mode signal (first conduction control power saving mode signal, for example) and an Nch power saving mode signal (second conduction control power saving mode signal, for example) to the power saving control target circuit 103 based on these input signals. The Pch power saving mode signal is for reducing the leak current of the PMOS transistor existing in the power saving control target circuit 103 to generate the high leak current. The Nch power saving mode signal is for reducing the leak current of the NMOS transistor existing in the power saving control target circuit 103 to generate the high leak current.

Figure 3:
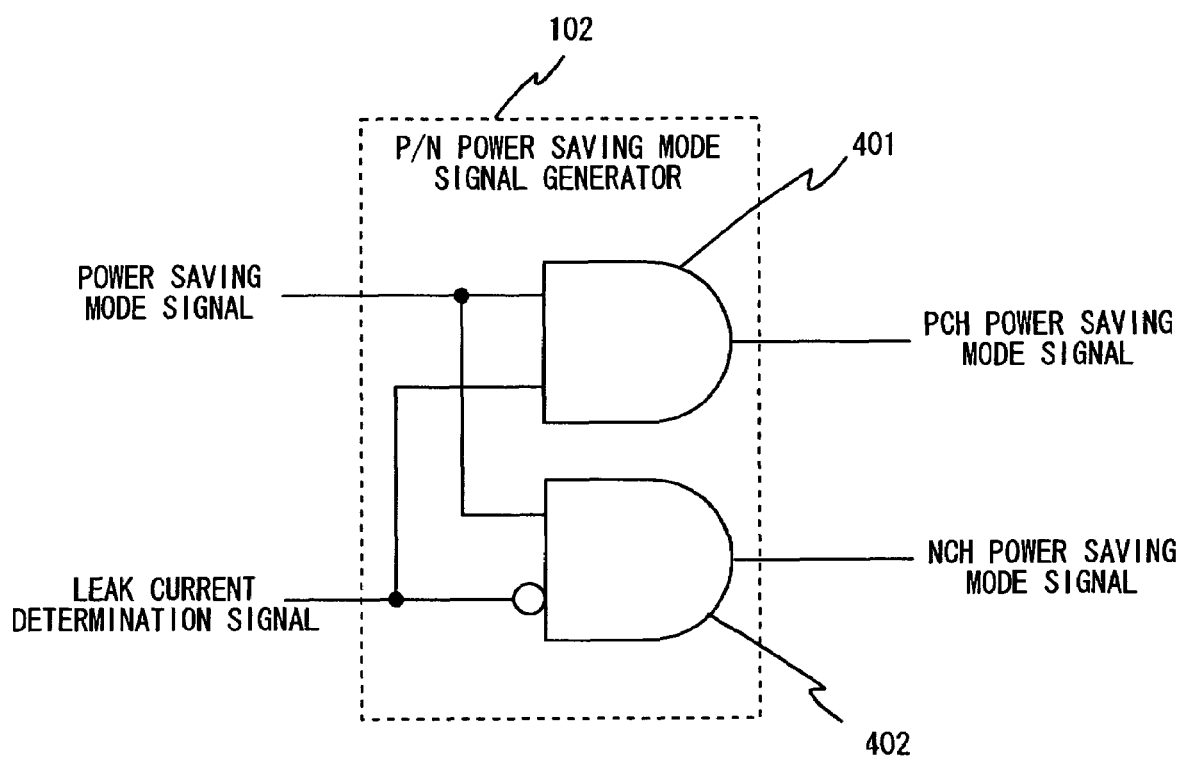
FIG. 3 is one example of a configuration of a P/N power saving mode signal generator of the semiconductor integrated circuit according to the first embodiment.

FIG. 3 shows a specific configuration example of the P/N power saving mode signal generator 102. This P/N power saving mode signal generator 102 includes an AND gate 401, and an AND gate 402 having one input terminal connected to an inverter. The AND gate 401 receives the power saving mode signal from one input terminal and receives the leak current determination signal from the P/N leak current comparator 101 from the other input terminal. Then the AND gate 401 outputs the Pch power saving mode signal. The AND gate 402 receives the power saving mode signal from one input terminal and receives the leak current determination signal from the P/N leak current comparator 101 from the other input terminal with its logic inverted. Then the AND gate 402 outputs the Nch power saving mode signal.

When the power saving mode signal is ineffective, which means an inactive level indicating that the signal is not in a power saving mode (low level, for example), the P/N power saving mode signal generator 102 fixes both of the Pch power saving mode signal and the Nch power saving mode signal as output signals to the low level. Now, the description will be made on a case in which the power saving mode signal is effective, which means an active level indicating the power saving mode (high level, for example). When the power saving mode signal is in the high level, the Pch power saving mode signal and the Nch power saving mode signal are changed based on the leak current determination signal which is the other input. For example, when the leak current determination signal is in the high level (when the leak current of the PMOS transistor M201 is larger), the Pch power saving mode signal is in the high level and the Nch power saving mode signal is in the low level. On the other hand, when the leak current determination signal is in the low level (when the leak current of the NMOS transistor M202 is larger), the Pch power saving mode signal is in the low level and the Nch power saving mode signal is in the high level.

Now, a relation between the power saving mode signal and the instruction pipeline processing part in the CPU will be described with reference to FIGS. 4, 5A, 5B, and 5c. The power saving mode signal is the signal controlling a disable state or an enable state of the computing unit or the like by inputting the high-level signal or the low-level signal to each computing unit (ALU or MULU or the like) or other stage processing parts (register file or the like) of the instruction pipeline processing part in the CPU.

Figure 4:
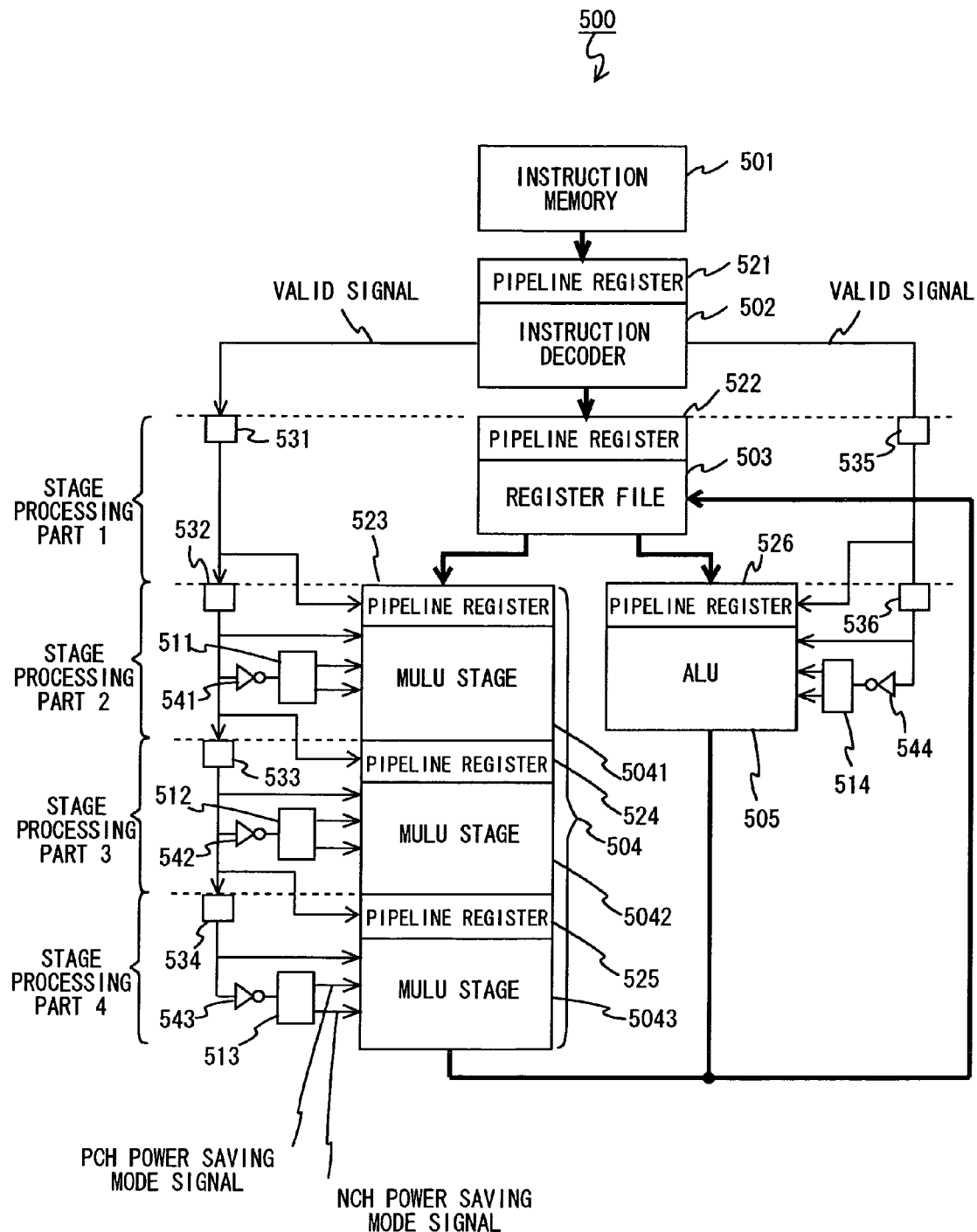
FIG. 4 is one example of a schematic diagram of an instruction pipeline processing part of the semiconductor integrated circuit according to the first embodiment.

FIG. 4 shows a configuration example of the instruction pipeline processing part in the CPU. The power saving mode signal used in the present embodiment may be a signal typically used such as a valid signal, for example. More specifically, the signals obtained by inverting the logic of the valid signals after being input to inverters 541 to 544 are employed as the power saving mode signals. This valid signal is output from the instruction decoder in high level when the computing unit of the instruction pipeline in the CPU is set to an enable state. On the other hand, when the computing unit or the like is not in the enable state, which means in a disable state, the low-level signal is output. Therefore, the power saving mode signal is in the low level when the valid signal sets the computing unit to the enable state in the high level, and the power saving mode signal is in the high level when the valid signal sets the computing unit to the disable state in the low level. As stated, the valid signal can be used as the power saving mode signal in each stage processing part. Further, by generating the power saving mode signal using the valid signal, the power of the pipeline processing part can be saved without setting the whole CPU or the whole semiconductor integrated circuit including the CPU to the disable state. Hereinafter, the high-level valid signal is input to the computing unit when the computing unit or the like is in the enable state, and the low-level valid signal is input to the computing unit when the computing unit or the like is in the disable state.

Note that the configuration of the instruction pipeline processing part is not limited to the configuration shown in FIG. 4. The characteristic of the present invention lies in the P/N power saving mode signal generator 102 added to the instruction pipeline, and the circuit configuration of each computing unit (power saving control target circuit).

As shown in FIG. 4, an instruction pipeline 500 includes an instruction memory 501, an instruction decoder 502, a register file 503, an MULU (MULtiply Unit) 504, an ALU (Arithmetic Logic Unit) 505, and P/N power saving mode signal generators 511 to 514 (102), delay circuits 531 to 536 formed by flip flops or the like, and inverters 541 to 544. Further, in this example, the MULU 504 includes three stage processing parts, each of which being called MULUs 5041, 5042, and 5043. Pipeline registers 521 to 525 are provided between each computing unit such as the ALU or the MULU, and between each stage processing part in the MULU. Accordingly, the data from the previous stage processing part or the like is taken into the next stage in accordance with the clock. The computing units 504 and 505 correspond to the power saving control target circuit 103 shown in FIG. 1. The P/N power saving mode signal generators 511 to 514 correspond to the P/N power saving mode signal generator 102 shown in FIG. 1. Although the leak current determination signal from the P/N leak current comparator 101 shown in FIG. 1 is input to 511 to 514 corresponding to the P/N power saving mode signal generator 102, this P/N leak current comparator 101 needs not be provided in each of the P/N power saving mode signal generators 511 to 514. Although not shown in FIG. 4 for the sake of clarity, a line from the P/N leak current comparator 101 is connected to each of the P/N power saving mode signal generators 511 to 514.

However, in changing the characteristic of the leak currents of the transistors M201 and M202 existing in the P/N leak current comparator 101 and ratio of the resistance values of the resistors R201 and R202 for each computing unit or each stage in the computing unit, the configuration including the P/N leak current comparator 101 and the P/N power saving mode signal generator 102 may be corresponded to each of the P/N power saving mode signal generators 511 to 514.

Figure 5A:
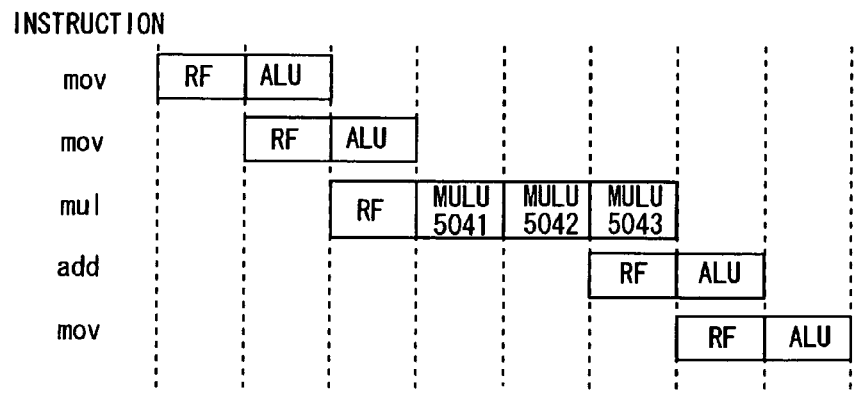
FIG. 5A is one example of an operation of each stage processing part of ALU and MULU in response to the instructions.
Figure 5B:
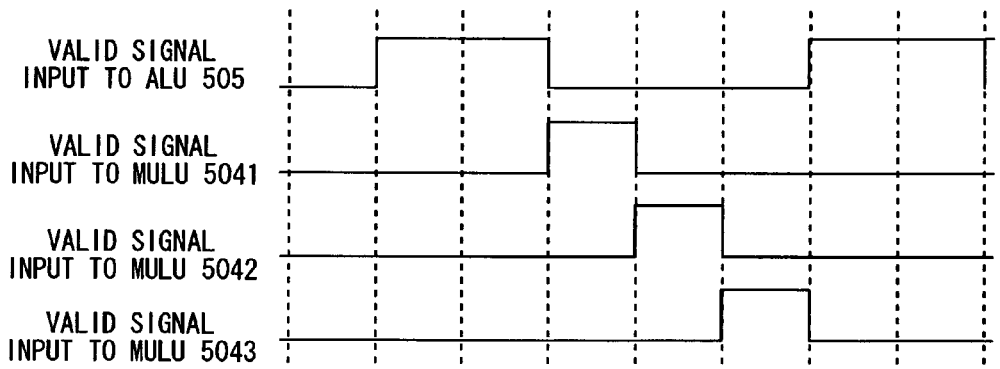
FIG. 5B is one example of valid signals input to each stage processing part of the ALU and the MULU.
Figure 5C:
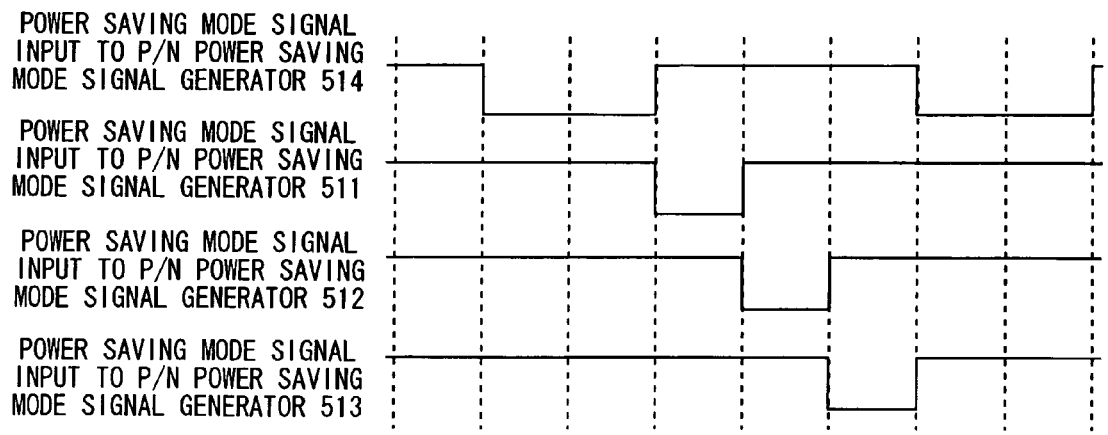
FIG. 5C is one example of power saving mode signals input to the P/N power saving mode signal generators.

FIG. 5 shows a timing chart of a pipeline operation of the instruction pipeline 500. FIG. 5A shows an operation of each stage processing part of the ALU and the MULU in response to the instructions. FIG. 5B shows the valid signals input to each stage processing part of the ALU and the MULU. As described above, the valid signal is in the high level when the MULU and the ALU are in the enable state, and is in the low level when the MULU and the ALU are in the disable state. FIG. 5C shows the power saving mode signals input to the P/N power saving mode signal generators 511 to 514. As can be seen from FIGS. 5B and 5C, the power saving mode signal is the signal obtained by inverting the logic of the valid signal. Note that "RF" in FIG. 5A means register fetch.

Now, an example of a basic operation of the instruction pipeline 500 shown in FIG. 4 will be described. First, the instruction decoder 502 reads out an instruction from the instruction memory 501. When the instruction that is read out is the instruction employing the ALU 505 (mov or add in FIG. 5A), the instruction decoder 502 outputs the high-level valid signal to the ALU 505. When the instruction that is read out is the instruction employing the MULU 504 (mul in FIG. 5A), then the instruction decoder 502 outputs the high-level valid signal to the MULU 504. At this time, the register file 503 reads out data into the computing unit if the valid signal of one of the computing units 504 and 505 is in the high level. The instruction decoder 502 typically outputs one clock high-level valid signal for one instruction. When a plurality of clocks are needed for executing the instruction, the instruction decoder 502 outputs corresponding clocks of the high-level valid signals for each one instruction. The computing unit is in the enable state and a normal operation is performed during a clock at which the high-level valid signal is input (hereinafter this state is called normal operation mode).

The valid signal is input to the delay circuits 531 to 536 provided in each stage processing part, and is transmitted to the next stage processing part with being delayed by one clock period. More specifically, we consider a case where the MULU is operated by the mul instruction. First, the mul instruction is read out to the instruction decoder 502 from the instruction memory 501, and then the instruction decoder 502 outputs the one clock high-level valid signal to the MULU 504. Then the valid signal is input to the delay circuit 531, and is output to the stage processing part 1 with being delayed by one clock.

When the high-level valid signal output from the delay circuit 531 is input to the stage processing part 1, the register file 503 reads out data. At the same time, the pipeline register 523 of the MULU 504 is made the enable state by the high-level valid signal so as to obtain the data from the register file 503. Then this valid signal is input to the delay circuit 532 to be output to the stage processing part 2 with being delayed by one clock.

When the high-level valid signal output from the delay circuit 532 is input to the stage processing part 2, the MULU 5041 is in the enable state to perform the normal operation, and the executing result is transmitted to the pipeline register 524. At the same time, the pipeline register 524 of the MULU 504 is made the enable state by the high-level valid signal to obtain the executing result of the MULU 5041. Then the valid signal is input to the delay circuit 533 and is output to the stage processing part 3 with being delayed by one clock.

When the high-level valid signal output from the delay circuit 533 is input to the stage processing part 3, the MULU 5042 is made the enable state to perform the normal operation. Then the executing result is transmitted to the pipeline register 525. At the same time, the pipeline register 524 of the MULU 504 is in the enable state by the valid signal to obtain the executing result of the MULU 5041. This high-level valid signal is input to the delay circuit 534 and is output to the stage processing part 4 with being delayed by one clock.

When the high-level valid signal output from the delay circuit 534 is input to the stage processing part 4, the MULU 5043 is made the enable state to perform the normal operation. Then the executing result is transmitted to the register file 503. The above description is about the example of the basic operation of the instruction pipeline 500 shown in FIG. 4.

As described above, when each stage processing part of the MULU does not perform the normal operation, which means in the disable state (hereinafter referred to as power saving mode), the valid signal is in the high-level. This is the basic operation of the instruction pipeline 500.

In the present embodiment, in each stage processing part of the MULU, the power saving mode signals input to the P/N power saving mode signal generators 511 to 513 are in the active level (high-level) in the power saving mode (when the low-level valid signal is input). Accordingly, the Pch power saving mode signal and the Nch power saving mode signal are output to each stage processing part of the MULU depending on the output result of the P/N leak current comparator 101. Note that one of the Pch power saving mode signal and the Nch power saving mode signal is in the high level and the other of the Pch power saving mode signal and the Nch power saving mode signal is in the low level.

Figure 6:
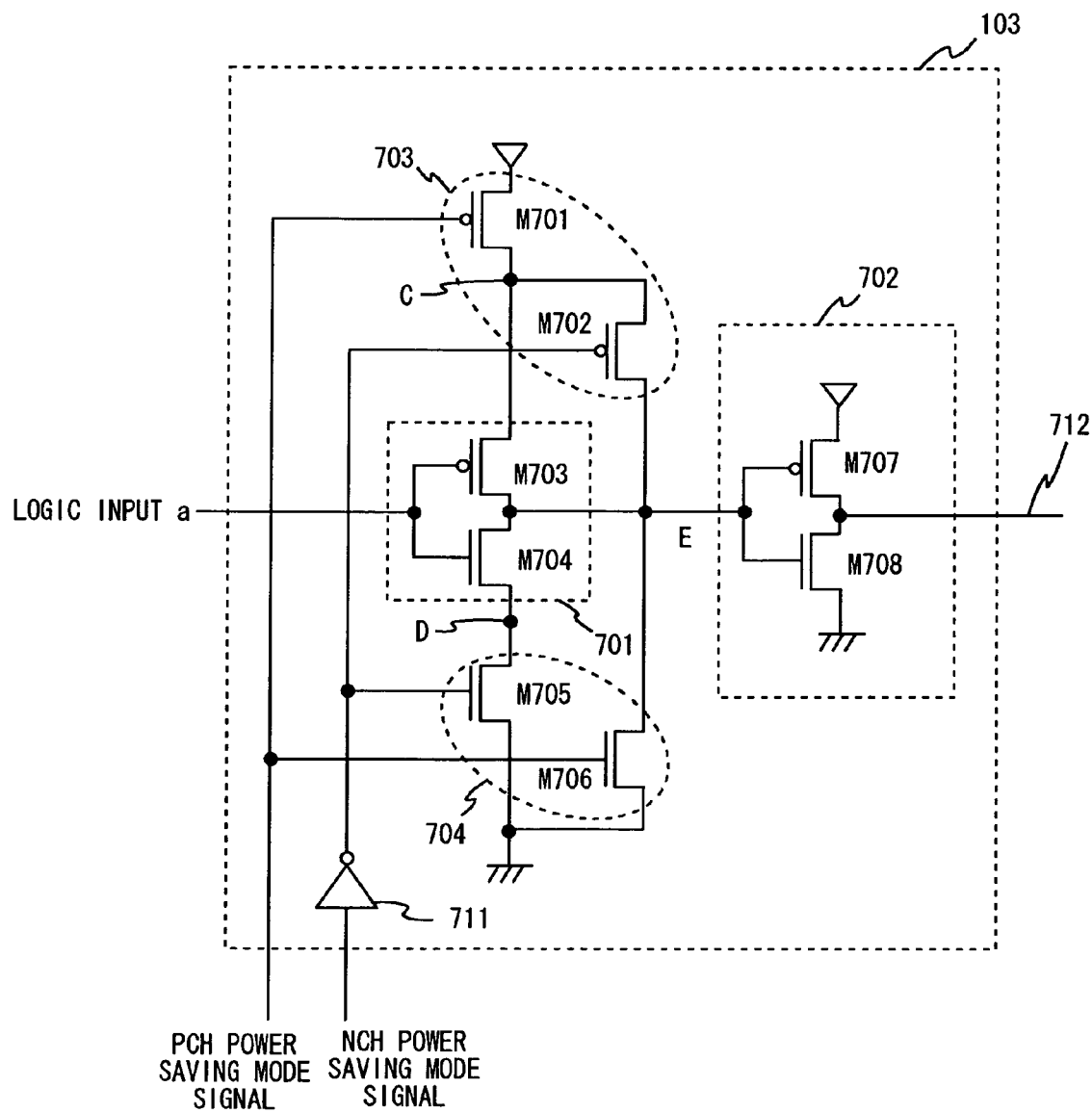
FIG. 6 is one example of a configuration of a power saving control target circuit of the semiconductor integrated circuit according to the first embodiment.

Now, the power saving control target circuit 103 (see FIG. 1) will be described. FIG. 6 shows an example of the circuit configuration of the power saving control target circuit 103. This power saving control target circuit 103 includes a logic gate part 701, a logic gate part 702 to which the logic output of the logic gate part 701 is input, and output fixing circuits 703 and 704 fixing the logic output of the logic gate part 701 to the power saving mode. The output fixing circuits 703 and 704 are called output fixing parts. Further, there is an inverter 711 for inverting the logic of the Nch power saving mode signal. Note that the inverter 711 may be included in the P/N power saving mode signal generator 102 (see FIG. 3) to be connected to the output of the AND gate 402. In this case, the inverter 711 needs not be included in the power saving control target circuit 103.

In the present embodiment, it is assumed by the logic gate part 702 that the leak current of either one of PMOS transistor M707 and NMOS transistor M708 is relatively larger. For example, it is assumed that the PMOS transistor M707 has larger leak current in OFF state than the NMOS transistor M708 does (more than twice larger, for example), or that the NMOS transistor M708 has larger leak current in OFF state than the PMOS transistor M707 does (more than twice larger, for example).

As an example of the transistor generating the high leak current, it is assumed that a gate length (L) is relatively short, a gate width (W) is relatively large, a threshold voltage is relatively low, or the like. These transistors may be the transistors having relatively large size used for the output buffer or the like. The transistors generating the high leak current only in the p channel or n channel may be employed as in the present embodiment depending on the manufacturing processes.

A wiring 712 in the output side of the logic gate part 702 may have large length of several hundred μm, or may have large output load (large fan out).

Although not specifically limited, the logic gate part 701 is formed as follows in the present embodiment. This logic gate part 701 includes a PMOS transistor M703 and an NMOS transistor M704 connected in series, which form the inverters for inverting a logic input a, so as to output the inverted logic input a to a node E. A source of the PMOS transistor M703 is connected to a node C, and a drain thereof is connected to the node E. A source of the NMOS transistor M704 is connected to a node D, and a drain thereof is connected to the node E.

Although not specifically limited, the logic gate part 702 is formed as follows in the present embodiment. The logic gate part 702 includes the PMOS transistor M707 and the NMOS transistor M708 connected in series, which form the inverters inverting the logic level of the node E, so as to output the inverted signal to the wiring 712. A source of the PMOS transistor M707 is connected to a high-potential side power supply, and a drain thereof is connected to the wiring 712. A source of the NMOS transistor M708 is connected to a low-potential side power supply, and a drain thereof is connected to the wiring 712.

Although not specifically limited, the output fixing circuit 703 is configured as follows in the present embodiment. The output fixing circuit 703 includes PMOS transistors M701 and M702. A gate of the PMOS transistor M701 receives the Pch power saving mode signal, a source thereof is connected to the high-potential side power supply, and a drain thereof is connected to the node C. A gate of the PMOS transistor M702 receives the inversion signal of the Nch power saving mode signal through the inverter 711, a source thereof is connected to the node C, and a drain thereof is connected to the node E.

Although not specifically limited, the output fixing circuit 704 is formed as follows in the present embodiment. The output fixing circuit 704 includes NMOS transistors M705 and M706. A gate of the NMOS transistor M705 receives the inversion signal of the Nch power saving mode signal through the inverter 711, a source thereof is connected to the low-potential side power supply, and a drain thereof is connected to the node D. A gate of the NMOS transistor M706 receives the Pch power saving mode signal, a source thereof is connected to the low-potential side power supply, and a drain thereof is connected to the node E.

Now, an operation of the semiconductor integrated circuit 100 (see FIG. 1) having the above configuration will be described. First, we consider a case in which the low-level power saving mode signal (inactive level) is input to the semiconductor integrated circuit 100 (when the computing unit or the like shown in FIG. 4 is in the enable state, which means in the normal operation mode). In this case, the low-level power saving mode signal is input to the P/N power saving mode signal generator 102 (see FIGS. 1 and 3). Then both of the Pch power saving mode signal and the Nch power saving mode signal output from the P/N power saving mode signal generator 102 are in the low level regardless of whether the leak current determination signal from the P/N leak current comparator 101 is in the low level or the high level. Accordingly, the low-level Pch power saving mode signal and the Nch power saving mode signal are input to the power saving control target circuit 103. Hence, the PMOS transistor M701 included in the output fixing circuit 703 (see FIG. 6) is turned on so as to connect the high-potential side power supply and the logic gate part 701. Further, the PMOS transistor M702 included in the output fixing circuit 703 is turned off so that the node C connected to the high-potential side power supply and the node E are disconnected. Further, the NMOS transistor M705 included in the output fixing circuit 704 is turned on so that the low-potential side power supply and the logic gate part 701 are connected. Further, the NMOS transistor M706 included in the output fixing circuit 704 is turned off so that the low-potential side power supply and the node E are disconnected. Accordingly, the logic gate part 701 operates as the normal inverter. The logic gate part 702 also performs the normal operation receiving the output of the logic gate part 701 as the input.

Now, we consider a case in which the high-level power saving mode signal (active level) is input to the semiconductor integrated circuit 100 (the computing unit or the like of FIG. 4 is in the disable state, which means the power saving mode) and the leak current of the PMOS transistor M707 included in the power saving control target circuit 103 (see FIG. 6) is larger than that of the NMOS transistor M708. The P/N leak current comparator 101 (see FIGS. 1 and 2) includes the PMOS transistor M201 and the NMOS transistor M202. The PMOS transistor M201 and the NMOS transistor M202 are manufactured by the process same to that of the PMOS transistor M707 and the NMOS transistor M708 included in the logic gate part 702 of the power saving control target circuit 103.

In this case, the leak current of the PMOS transistor M201 of the P/N leak current comparator 101 is larger than that of the NMOS transistor M202, whereby the potential of the node B is higher than the reference voltage of the node A. Accordingly, the leak current determination signal, which is the output of the comparator 201, is in the high level. This leak current determination signal is input to the AND gates 401 and 402 of the P/N power saving mode signal generator 102 (see FIG. 3). At this time, the power saving mode signal is also in the high level, so that the Pch power saving mode signal, which is the output of the P/N power saving mode signal generator 102, is in the high level, and the Nch power saving mode signal is in the low level.

This high-level Pch power saving mode signal and the low-level Nch power saving mode signal are input to the power saving control target circuit 103. This high-level Pch power saving mode signal turns off the PMOS transistor M701 of the output fixing circuit 703 so that the logic gate part 701 and the high-potential side power supply are disconnected. Further, the high-level Pch power saving mode signal turns on the NMOS transistor M706 of the output fixing circuit 704 so as to connect the node E with the low-potential side power supply and sets the logical value of the node E to the low level.

The low-level Nch power saving mode signal is logic-inverted in the inverter 711, and is input to the gate of the PMOS transistor M702 of the output fixing circuit 703 and to the gate of the NMOS transistor M705 of the output fixing circuit 704 as the high-level signal. Accordingly, the PMOS transistor M702 of the output fixing circuit 703 is turned off so that the node E and the node C connected to the high-potential side power supply are disconnected. Further, the NMOS transistor M705 of the output fixing circuit 704 is turned on so that the logic gate part 701 and the low-potential side power supply are connected.

From the above description, the logical value of the node E is forced to be in the low level. Accordingly, the PMOS transistor M707 of the logic gate part 702 is turned on and the NMOS transistor M708 is turned off. Hence, the PMOS transistor M707 generating the high leak current is forced to be in the ON state, and the NMOS transistor M708 having a relatively small leak current is forced to be in the OFF state. Accordingly, the pass-through current of the logic gate part 702 flows only in the NMOS transistor M708 having a relatively small leak current. If the logical value input to the logic gate 702 is not controlled by the output fixing circuits 703 and 704 described above, the pass-through current of the logic gate 702 increases due to the PMOS transistor M707 having a large leak current.

Now, we consider a case in which the high-level power saving mode signal is input to the semiconductor integrated circuit 100 (the computing unit or the like of FIG. 4 is in the disable state, which means the power saving mode) and the leak current of the NMOS transistor M708 included in the power saving control target circuit 103 is larger than that of the PMOS transistor M707. The P/N leak current comparator 101 includes the transistors M201 and M202 manufactured by the same process as that of the transistors M707 and M708 of the power saving control target circuit 103 as described above.

In this case, since the leak current of the NMOS transistor M202 of the P/N leak current comparator 101 becomes larger than that of the PMOS transistor M201, the potential of the node B is lower than the reference voltage of the node A. Accordingly, the leak current determination signal, which is the output of the comparator 201, is in the low level. This low-level leak current determination signal is input to the AND gates 401 and 402 of the P/N power saving mode signal generator 102. At this time, since the power saving mode signal is also in the low level, the Pch power saving mode signal, which is the output of the P/N power saving mode signal generator 102, is in the low level, and the Nch power saving mode signal is in the high level.

The low-level Pch power saving mode signal and the high-level Nch power saving mode signal are input to the power saving control target circuit 103. This low-level Pch power saving mode signal turns on the PMOS transistor M701 of the output fixing circuit 703 so as to connect the logic gate part 701 with the high-potential side power supply. Further, the low-level Pch power saving mode signal turns off the NMOS transistor M706 of the output fixing circuit 704 so that the node E and the low-potential side power supply are disconnected.

The high-level Nch power saving mode signal is logic-inverted in the inverter 711, and is input to the gate of the PMOS transistor M702 of the output fixing circuit 703 and to the gate of the NMOS transistor M705 of the output fixing circuit 704 as the low-level signal. Hence, the PMOS transistor M702 of the output fixing circuit 703 is in the ON state so as to connect the node E with the node C connected to the high-potential side power supply and set the logical value of the node E to the high level. Further, the NMOS transistor M705 of the output fixing circuit 704 is turned off so that the logic gate part 701 and the low-potential side power supply are disconnected.

As described above, the logical value of the node E is forced to be in the high level. Accordingly, the PMOS transistor M707 of the logic gate part 702 is turned off, and the NMOS transistor M708 is turned on. Accordingly, the NMOS transistor M708 generating the high leak current is forced to be in the ON state, and the PMOS transistor M707 having a relatively small leak current is turned on. Therefore, the pass-through current of the logic gate part 702 flows only in the PMOS transistor M707 having a relatively small leak current. If the logical value input to the logic gate 702 is not controlled by the output fixing circuits 703 and 704 as described above, the pass-through current of the logic gate 702 increases due to the NMOS transistor M708 having a large leak current.

As described above, according to the semiconductor integrated circuit 100 of the present embodiment, the P/N power saving mode signal generator 102 generates the Pch power saving mode signal and the Nch power saving mode signal based on the power saving mode signal (control signal such as the valid signal, for example) which disables (or enables) each computing unit (hereinafter referred to as power saving control target circuit 103) in the instruction pipeline 500 in the CPU and the leak current determination signal output from the P/N leak current comparator 101. Then the transistor having a large leak current (M707 or M708) is forced to be in the ON state in the power saving control target circuit 103 based on these Pch power saving mode signal and the Nch power saving mode signal.

Since the pass-through current can be flowed only in the MOS transistor having a small leak current when the power saving control target circuit 103 is in the disable state, the leak current of the power saving control target circuit 103 can be reduced.

Further, in the present configuration, the P/N leak current comparator 101 includes the PMOS transistor (M201 in FIG. 2) and the NMOS transistor (M202 in FIG. 2) which are manufactured by the same process as that of the transistors in the power saving control target circuit 103. Then the leak currents of the transistors are constantly monitored, and the comparing result is output to the P/N power saving mode signal generator 102 as the leak current determination signal. Accordingly, there is no need to consider which of the leak currents of the P-type transistor and the N-type transistor is larger due to the influence of the manufacturing process or the like in the designing stage, which makes it possible to provide high flexibility in designing.

Further, although the magnitude relation of the leak currents of the PMOS transistor and the NMOS transistor may be changed along with the difference of the threshold value for each transistor or the change of the environmental temperature (including the temperature change due to the heat release of the transistor itself), the present invention can cope with such a change.

Furthermore, according to the configuration of the present invention, the ON/OFF control of the transistor can be realized with the valid signal which has been employed as the instruction pipeline in the CPU without adding the new signal. In the configuration of the present invention, the valid signal is the enable signal of the power saving control target circuit 103 (power saving mode signal). Thus, it is not needed to reexamine the design of the signal timing or the like of the CPU, and only a small number of circuits needs to be added.

Further, the output fixing circuits 703 and 704 in the power saving control target circuit 103 are not connected to the circuit in the output stage having transistors generating the high leak current (the logic gate part 702 shown in FIG. 6) but are connected to the circuit formed by transistors having a small leak current in the previous stage of the logic gate part 702 (the logic gate part 701 shown in FIG. 6). Accordingly, it is possible for the output fixing circuits 703 and 704 to cut off the power supply to the logic gate part 701 in the previous stage when the power saving control target circuit 103 is in the disable state and to control the conduction state of the transistors M707 and M708 of the logic gate part 702 of the output stage. Since the logic gate part 701 in the previous stage has a relatively smaller load than that of the logic gate part 702 of the output stage, it is possible to reduce the influence of the delay due to the increase of the ON resistance of the transistor. Accordingly, the problem of related arts can be solved that it takes time to control the body voltage of the transistor in accordance with the voltage change and it is impossible to perform fine control within a short time. Hence, it is possible to control power saving even in a quite short time in which the pipeline processing part or the like of the CPU is disabled. As stated above, according to the semiconductor integrated circuit 100 of the present embodiment, it is possible to realize the optimal power saving control in consideration of the variation of the manufacturing process without affecting the operating speed of the circuit.

Figure 7:
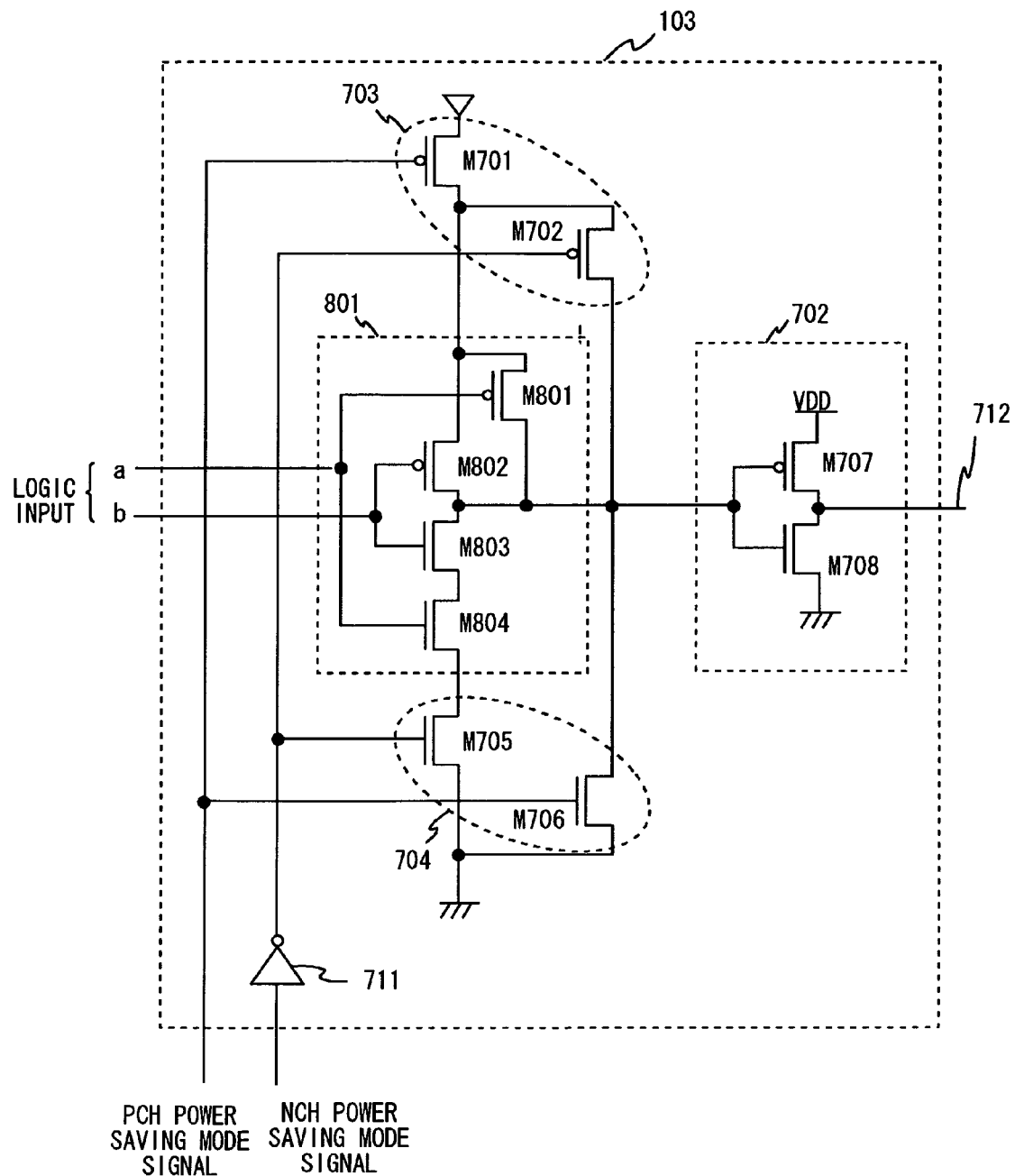
FIG. 7 is one example of a configuration of the power saving control target circuit of the semiconductor integrated circuit according to the first embodiment.

In the present embodiment, the transistor having relatively large leak current (M707 or M708) in the power saving control target circuit 103 is in the ON state and the transistor having a small leak current is in the OFF state. However, the present invention is not limited to this. In summary, the implementation of the power saving control target circuit 103 is not limited to the example of FIG. 6 but may have any configuration as long as it focuses on one leak current of PMOS transistor or the NMOS transistor to perform controlling. For example, the power saving control target circuit 103 may have a logic gate part 801 having two inputs as shown in FIG. 7 in place of the logic gate part 701 having one input as shown in FIG. 6. The circuit shown in FIG. 7 can also function in the same way as the circuit shown in FIG. 6 and can realize the same effect as in the circuit shown in FIG. 6.

Figure 8:
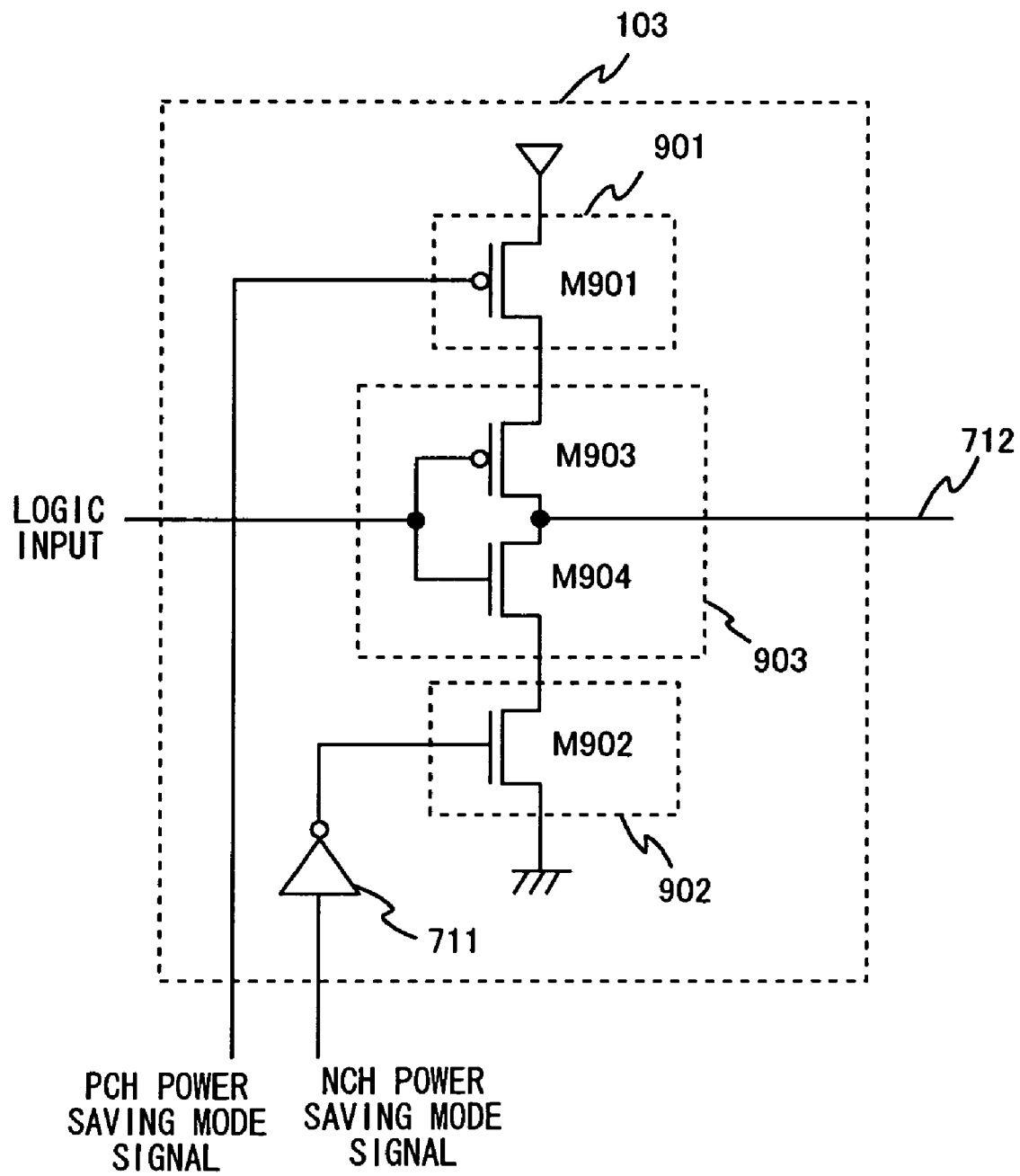
FIG. 8 is one example of a configuration of the power saving control target circuit of the semiconductor integrated circuit according to the first embodiment.

Furthermore, the power saving control target circuit 103 may include a logic gate part 903, a source separating circuit 901, and a source separating circuit 902 as shown in FIG. 8. The logic gate part 903 functions as a logic gate part including a transistor generating high leak current, the source separating circuit 901 controls the current supply from the high-potential side power supply, and the source separating circuit 902 controls the current supply from the low-potential side power supply. In the configurations shown in FIGS. 6 and 7, the conduction state of the transistor having a relatively large leak current is controlled by the Pch power saving mode signal and the Nch power saving mode signal. However, in the configuration shown in FIG. 8, the conduction state of the transistor having a relatively large leak current is controlled by the PMOS transistor M901 and the NMOS transistor M902 of the source current separating circuit 901 by the Pch power saving mode signal and the Nch power saving mode signal.

Now, we consider a case in which the leak current of the PMOS transistor M903 is larger than that of the NMOS transistor M904 in the configuration shown in FIG. 8. As described above, since the leak current of the PMOS transistor M903 in the power saving control target circuit 103 is larger than that of the NMOS transistor M904 as described above, the Pch power saving mode signal output from the P/N leak current comparator 101 is in the high level, and the Nch power saving mode signal is in the low level. Accordingly, the PMOS transistor M901 of the source current separating circuit 901 is in the OFF state, and the NMOS transistor M902 is in the ON state. Since the PMOS transistor M901 is turned off, the current is disconnected regardless of whether the PMOS transistor M903 of the logic gate part 903 is in the ON state or the OFF state. Since the NMOS transistor M902 is in the ON state, the logic gate part 903 is connected to the low-potential side power supply. However, the PMOS transistor M903 having a large leak current is not supplied with the current as described above, so that there is no influence on the pass-through current of the power saving control target circuit 103. On the contrary, when the leak current of the NMOS transistor M904 is larger than that of the PMOS transistor M903, the PMOS transistor M901 of the source current separating circuit 901 is in the ON state and the NMOS transistor M902 is in the OFF state. Also in this case, the NMOS transistor M904 having a large leak current is not supplied with the current; therefore there is no influence on the pass-through current of the power saving control target circuit 103. As stated, also in this example, it is possible to effectively reduce the leak current of the circuit due to the variation of the manufacturing process.

Second Embodiment

Figure 9:
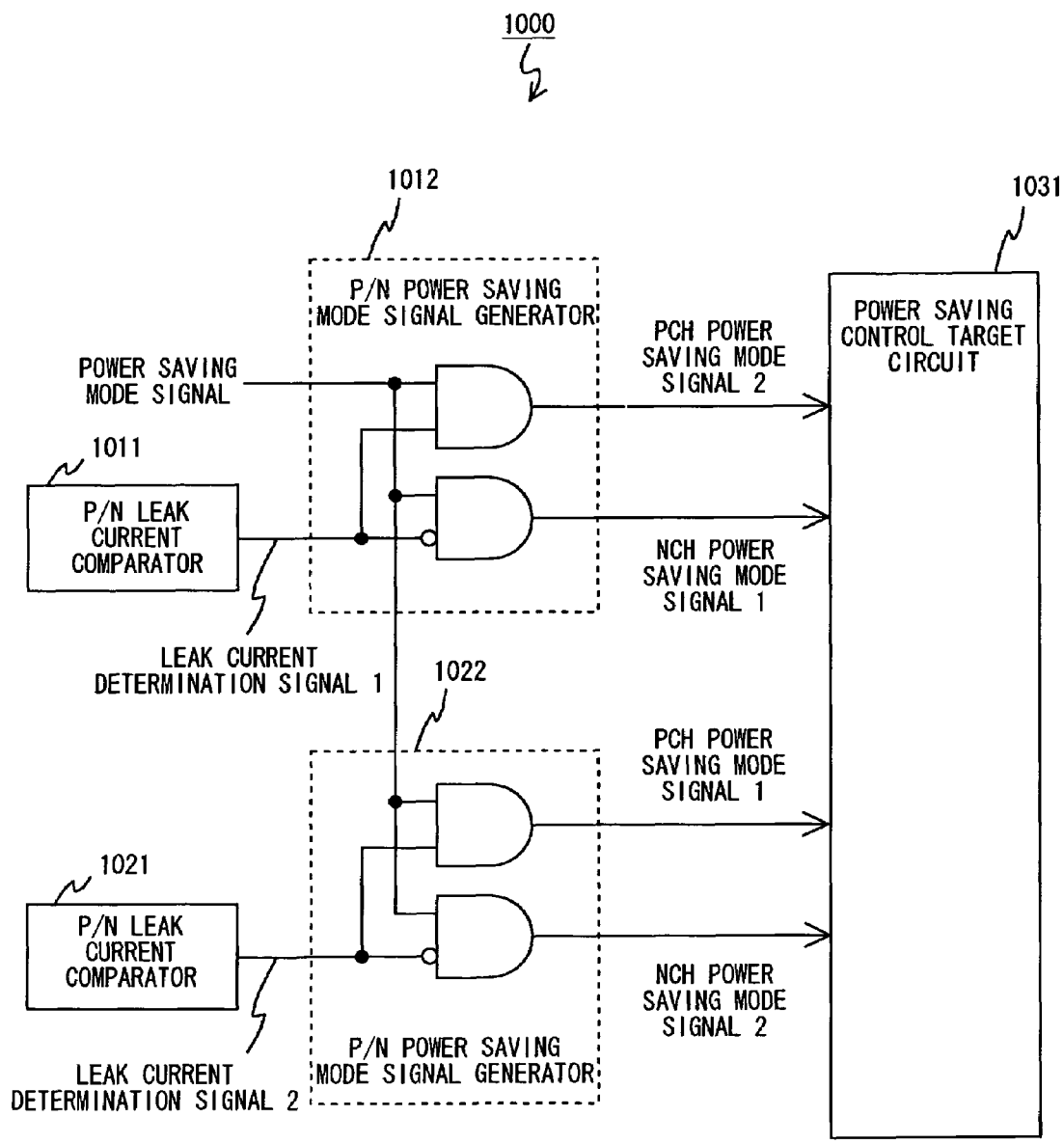
FIG. 9 is one example of a block configuration of a semiconductor integrated circuit according to a second embodiment.

Hereinafter, another embodiment of the present invention will be described. FIG. 9 shows a configuration example of a semiconductor integrated circuit 1000 according to the present embodiment. The difference between the first embodiment and the second embodiment is that there are a plurality of P/N leak current comparators 1011 and 1021 in the second embodiment and a plurality of sets of Pch and Nch power saving mode signals are input to the power saving control target circuit 1031 in accordance with characteristics of a plurality of transistors. Although two sets of Pch and Nch power saving mode signals are input to the power saving control target circuit 1031 by the two P/N leak current comparators 1011 and 1021 in the configuration shown in FIG. 9, the number thereof is not limited.

Figure 10:
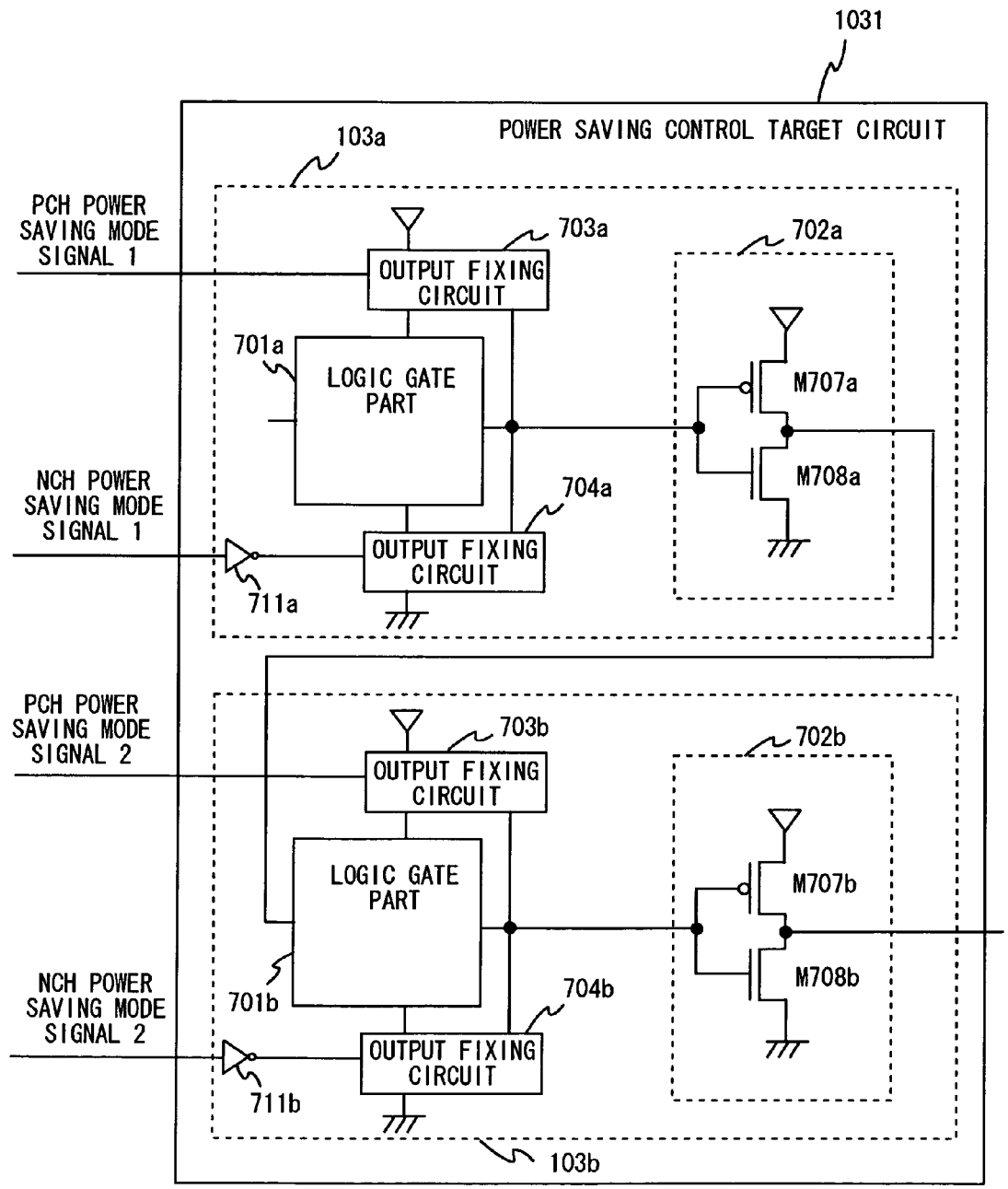
FIG. 10 is one example of a configuration of a power saving control target circuit of the semiconductor integrated circuit according to the second embodiment.

Since the P/N power saving mode signal generators 1012 and 1022 have the same configuration as that of the P/N power saving mode signal generator 102 shown in FIG. 3, the overlapping description thereof will be omitted. FIG. 10 shows a detailed circuit configuration of the power saving control target circuit 1031 shown in FIG. 9. The transistor (or transistor group) having a gate whose ability of Pch is relatively high and the transistor (or transistor group) having a gate whose ability of Nch is relatively low are mixed in the power saving control target circuit 1031, for example.

FIG. 10 shows an example of the power saving control target circuit 1031 including two power saving control target circuits 103 (hereinafter referred to as circuit units 103a and 103b) which are the same as shown in FIG. 6. A case is assumed that the characteristics of the PMOS transistor and the NMOS transistor forming the logic gate parts 702a and 702b of the circuit units 103a and 103b are different. It is assumed here that the leak current of the PMOS transistor M707a in the logic gate part 702a is larger than that of the NMOS transistor M708a and the leak current of the NMOS transistor M708b in the logic gate part 702b is larger than that of the PMOS transistor M707b. The operation in the power saving mode will hereinafter be described according to its condition.

The P/N leak current comparator 1011 includes transistors manufactured by the same process as that of the PMOS transistor M707a and the NMOS transistor M708a shown in FIG. 9. Similarly, the P/N leak current comparator 1021 includes transistors manufactured by the same process as that of the PMOS transistor M707b and the NMOS transistor M708b shown in FIG. 9. Accordingly, the high-level leak current determination signal 1 and the low-level leak current determination signal 2 are output from the P/N leak current comparators 1011 and 1021, respectively. These signals are the comparing result in accordance with the transistor characteristics included in the comparators. The leak current determination signal 1 and the leak current determination signal 2 are input to the P/N power saving mode signal generators 1012 and 1022, respectively. Then a pair of the high-level Pch power saving mode signal 1 and the low-level Nch power saving mode signal 1, and a pair of the low-level Pch power saving mode signal 2 and the high-level Nch power saving mode signal 2 are output to the circuit units 103a and 103b in the power saving control target circuit 1031.

Accordingly, the circuit unit 103a in the power saving control target circuit 1031 receives the Pch power saving mode signal 1 and the Nch power saving mode signal 1 in accordance with the characteristic of the transistor as in the first embodiment so as to be operated. In the same way, the circuit unit 103b receives the Pch power saving mode signal 2 and the Nch power saving mode signal 2 in accordance with the characteristic of the transistor so as to be operated. The operation of each circuit unit 103a and 103b is the same as that in the above first embodiment, and the overlapping description thereof will be omitted.

When there is a transistor (or transistor group) having a gate whose ability of Pch is relatively high and a transistor (or transistor group) having a gate whose ability of Nch is relatively high mixedly included in the power saving control target circuit 1031 as in the semiconductor integrated circuit 1000 according to the present embodiment, the leak current can be reduced more effectively by making the P/N leak current comparators 1011 and 1021 corresponding to each of the transistor characteristics correspondent to each other. Even when the different leak current is generated for each circuit unit 103a and 103b due to the temperature change or the like, the present invention can deal with this situation.

Figure 11:
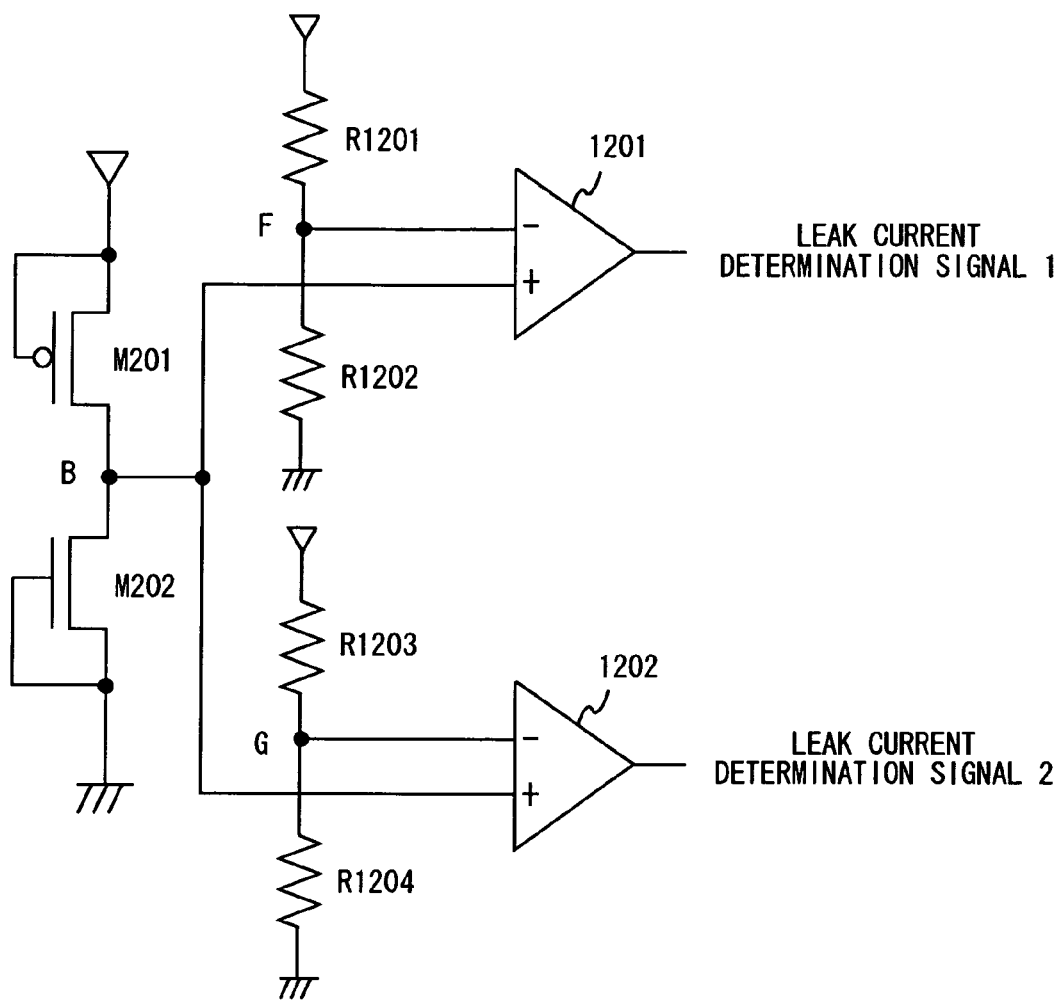
FIG. 11 is one example of a configuration of a P/N current comparator of a semiconductor integrated circuit according to another embodiment.

The present invention is not limited to the above embodiments but can be changed as appropriate without departing from the spirit of the present invention. For example, as shown in FIG. 11, the P/N leak current comparator may include resistors R1201, R1202, R1203, R1204 for dividing the resistance, and a node F and a node G may be connected to different reference voltages. By providing the resistors generating a plurality of reference voltages as above, it is not needed to provide the plurality of P/N leak current comparators 1011 and 1021 unlike the second embodiment.

Figure 12:
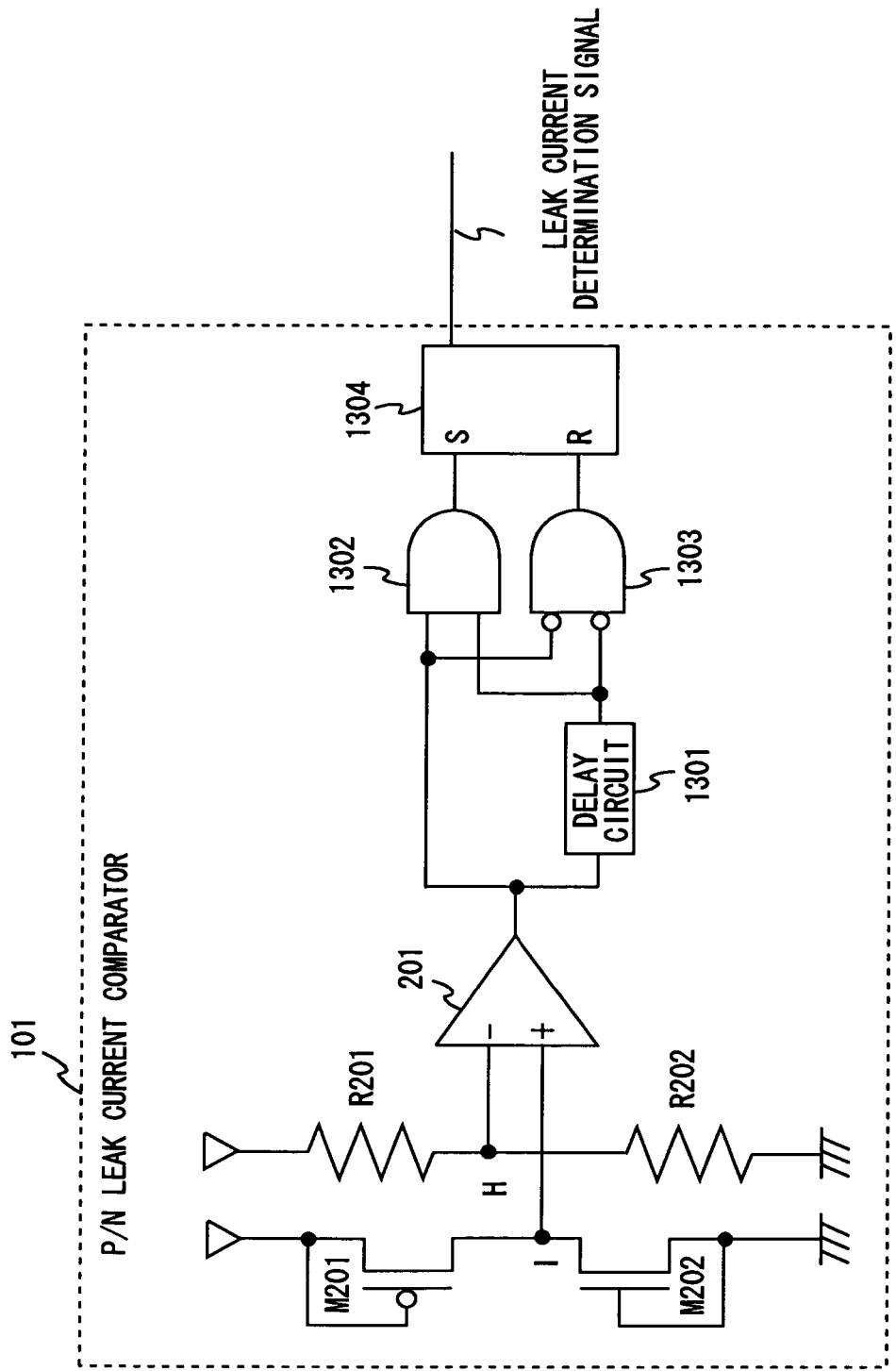
FIG. 12 is one example of a configuration of the P/N current comparator of the semiconductor integrated circuit according to another embodiment.

The P/N leak current comparator 101 may have a configuration as shown in FIG. 12. The P/N leak current comparator 101 includes a delay circuit 1301, logic circuits 1302 and 1303, and a latch circuit 1304 after the output terminal of the comparator 201 shown in FIG. 2. The P/N leak current comparator 101 includes a function of preventing the output logical value of the leak current determination signal from being frequently switched when the leak current value of the PMOS transistor M201 and the leak current value of the NMOS transistor M202 are close to each other. The operation by the P/N leak current comparator 101 will now be described.

First, we consider a case in which the output of the latch circuit 1304 is in the low level, and the output of the comparator 201 changes from the low level to the high level. In this case, if the output of the comparator 201 keeps the high-level state for more than a predetermined delay time by the delay circuit 1301, the output of the delay circuit 1301 changes from the low level to the high level. Accordingly, both ends of the two input terminals of the logic circuit 1302 are made high level. Then the output of the logic circuit 1302 is also made high level, and the output of the latch circuit 1304 is made high level. On the other hand, when the output of the comparator 201 changes from the high level to the low level in less than the predetermined delay time by the delay circuit 1301, the output of the delay circuit 1301 remains the low level. Then the output of the logic circuit 1302 is made low level, and the output of the latch circuit 1304 remains the low level and does not change. In summary, the output of the latch circuit 1304, which is the output from the P/N leak current comparator 101, does not change in a change where the output of the comparator 201 temporarily becomes high level.

Next, we consider a case in which the output of the latch circuit 1304 is in the high level and the output of the comparator 201 changes from the high level to the low level. In this case, the output of the delay circuit 1301 changes from the high level to the low level if the output of the comparator 201 keeps the low-level state for more than a predetermined delay time by the delay circuit 1301. Accordingly, both ends of the two input terminals of the logic circuit 1303 are in low level. Then the output of the logic circuit 1303 is also made high level and the output of the latch circuit 1304 changes to the low level. On the other hand, if the output of the comparator 201 changes from the low level to the high level in less than the predetermined delay time by the delay circuit 1301, the output of the delay circuit 1303 keeps the high level. Then the output of the logic circuit 1303 is made low level, and the output of the latch circuit 1304 keeps the high level and does not change. The output of the latch circuit 1304, which is the output from the P/N leak current comparator 101, does not change in a change where the output of the comparator 201 temporarily becomes low level.

As described above, according to the P/N leak current comparator 101 shown in FIG. 12, it is possible to prevent the output logical value of the leak current determination signal which is the output signal from being frequently switched. Hence, it is possible to prevent the operating current from being increased in the circuits after the P/N leak current comparator 101 by the frequent switching of the output logical value.

It is apparent that the present invention is not limited to the above embodiments, but may be modified and changed without departing from the scope and spirit of the invention.

What is claimed is:

1. A semiconductor integrated circuit, comprising:
a leak current comparator comparing a leak current of a first conductive type transistor with a leak current of a second conductive type transistor to output a comparing result; and
a conduction control signal generator outputting a signal determining a conduction state of the first conductive type transistor and a conduction state of the second conductive type transistor in a control target circuit based on the comparing result in a power saving mode.

2. The semiconductor integrated circuit according to claim 1, wherein the leak current comparator outputs the comparing result based on a voltage decrease amount of the first conductive type transistor and a voltage decrease amount of the second conductive type transistor.

3. The semiconductor integrated circuit according to claim 1, wherein the leak current comparator comprises a comparator comparing a potential generated by a voltage decrease amount of the first conductive type transistor and a voltage decrease amount of the second conductive type transistor connected in series with each other with a reference potential divided by a first resistance element and a second resistance element connected in series with each other.

4. The semiconductor integrated circuit according to claim 1, wherein the conduction control signal generator receives an output of the comparing result made by the leak current comparator and a power saving mode signal output in the power saving mode, and outputs a first conduction control power saving mode signal and a second conduction control power saving mode signal into the control target circuit.

5. The semiconductor integrated circuit according to claim 1, wherein the power saving control target circuit comprises:
a logic gate part including the first conductive type transistor and the second conductive type transistor; and
an output fixing part fixing an input logical value of the logic gate part in the power saving mode.

6. The semiconductor integrated circuit according to claim 1, wherein
the power saving control target circuit receives an output of the comparing result made by the leak current comparator and a power saving mode signal output in the power saving mode, and outputs a first conduction control power saving mode signal and a second conduction control power saving mode signal into the control target circuit,
the power saving control target circuit comprises:
a logic gate part including the first conductive type transistor and the second conductive type transistor; and
an output fixing part fixing an input logical value of the logic gate part in the power saving mode, and
the output fixing part comprises:
a first output fixing circuit to which the first conduction control power saving mode signal is input; and
a second output fixing circuit to which the second conduction control power saving mode signal is input.

7. The semiconductor integrated circuit according to claim 1, wherein the control target circuit forms a pipeline stage processing part in a microcomputer.

8. The semiconductor integrated circuit according to claim 7, wherein the power saving mode signal sets the pipeline stage processing part in the microcomputer to a disable state according to a logical value of the power saving mode signal.

9. A method of controlling a semiconductor integrated circuit, the method comprising:
comparing a leak current of a first conductive type transistor with a leak current of a second conductive type transistor; and determining a conduction state of the first conductive type transistor and a conduction state of the second conductive type transistor in a control target circuit based on a comparing result in a power saving mode.

10. The method of controlling the semiconductor integrated circuit according to claim 9, wherein the comparing result is determined based on a voltage decrease amount of the first conductive type transistor and a voltage decrease amount of the second conductive type transistor.

* * * * *